United States Patent
Smith et al.

(10) Patent No.: US 8,015,516 B2
(45) Date of Patent: Sep. 6, 2011

(54) SYSTEM AND METHOD FOR CREATING A LOGICAL REPRESENTATION OF A FUNCTIONAL LOGIC SYSTEM FROM A PHYSICAL REPRESENTATION

(75) Inventors: Donald S. Smith, Tucson, AZ (US);
Michael H. Stamps, Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 804 days.

(21) Appl. No.: 12/016,453

(22) Filed: Jan. 18, 2008

(65) Prior Publication Data

US 2009/0187875 A1    Jul. 23, 2009

(51) Int. Cl.
*G06F 9/45* (2006.01)
(52) U.S. Cl. ....................................... 716/103
(58) Field of Classification Search .................. 716/3, 5, 716/103
See application file for complete search history.

(56) References Cited

U.S. PATENT DOCUMENTS

| | | | |
|---|---|---|---|
| 5,493,507 A | 2/1996 | Shinde et al. | |
| 5,586,046 A | 12/1996 | Feldbaumer et al. | |
| 5,751,592 A | 5/1998 | Takai et al. | |
| 6,195,629 B1 | 2/2001 | Bargh et al. | |
| 6,298,452 B1 | 10/2001 | Hill | |
| 6,353,915 B1 | 3/2002 | Deal et al. | |
| 6,530,069 B2 | 3/2003 | Jennion et al. | |
| 6,539,522 B1 | 3/2003 | Devins et al. | |
| 6,813,751 B2 | 11/2004 | Kubista | |
| 6,868,531 B1 * | 3/2005 | Hovanetz ........................... 716/1 |
| 7,069,206 B2 | 6/2006 | Movall et al. | |
| 7,168,041 B1 * | 1/2007 | Durrill et al. ................. 715/700 |
| 2005/0198606 A1 | 9/2005 | Gupta et al. | |
| 2006/0031815 A1 | 2/2006 | Bhagia et al. | |

FOREIGN PATENT DOCUMENTS

JP    09311882    12/1997

OTHER PUBLICATIONS

Xu et al.; "A TLM platform for system-on-chip simulation and verification"; Apr. 2005; IEEE VLSI-TSA International Symposium; pp. 1-2.*
Romain et al.; "Design and verification of mixed-signal I/O IPs: an 12C bus controller"; May 2004; IEEE International Symposium; pp. 1-5.*
Zaki et al.; "Formal Verification of Analog and Mixed Signal Designs: Survey and Comparison"; Jun. 2006;North-East Workshop on Circuits and Systems; pp. 1-4.*
IBM TDB, Automated Physical Design Utility for Reworking Circuit Panels, ip.com, 05-93, vol. 36, No. 5, pp. 57-258.

* cited by examiner

*Primary Examiner* — Suresh Memula
(74) *Attorney, Agent, or Firm* — Quarles & Brady LLP

(57) ABSTRACT

A system and method for transforming a physical representation of a functional logic system or sub-system to a logical representation of the same functional logic system or sub-system. One embodiment provides a method comprising loading a physical hardware description language (HDL) representation of the system or creating a physical HDL representation from a physical schematic of the system, identifying the power nets and component blocks, identifying initial conditions on the power nets and component blocks, converting connector blocks to hierarchical IO logical HDL representations, converting appropriate component blocks to logical HDL representations, deleting component blocks appropriate for deletion, and converting resistor components to logical HDL representations.

20 Claims, 4 Drawing Sheets

SYSTEM AND METHOD FOR CREATING A LOGICAL REPRESENTATION OF A FUNCTIONAL LOGIC SYSTEM FROM A PHYSICAL REPRESENTATION

BACKGROUND OF THE INVENTION

1. Field of the Invention

The present invention relates in general to verification of a functional logic system including multiple logical components and, more specifically, to a method and system for creating a logical representation of the functional logic system or sub-systems from a physical representation of the functional logic system or sub-systems.

2. Description of the Prior Art

With the advent of very large scale integration (VLSI) logic design, a process was needed to verify that logic designs functioned according to specification. A common method was to take the logic design, typically using the hardware description language (HDL) used to describe the actual logic design, and write a testbench simulation environment to verify the logic design. A testbench provides a hierarchical, static connection environment to the design, then dynamically provides input stimulus to the design and monitors for appropriate output behavior from the design. When the design is being verified in this type of simulation structure it is typically referred to as the Design Under Test (DUT).

SUMMARY OF THE INVENTION

In one embodiment, the present invention is a method of generating a logical representation of a functional logic system from a physical representation of the functional logic system. The method can include the steps of loading a physical hardware description language (HDL) representation of the system or creating a physical HDL representation from a physical schematic of the system, identifying from the physical HDL representation component blocks and power nets, which are a subset of all the nets or wiring connections between component blocks within the system (i.e., power nets are the nets identified as conveying the supply voltage and current to the components with the system), loading from a rule library initial condition rules for the power nets and the component blocks, assigning the initial condition rules to the power nets and component blocks, and using at least in part the initial condition rules to transform the physical HDL representation to a logical HDL representation by identifying connector blocks, which is a particular type of component block, and converting the connector blocks to hierarchical IO logical HDL representations, identifying component blocks appropriate for conversion to logical instantiations and converting the appropriate component blocks to logical HDL representations, identifying component blocks appropriate for deletion and deleting the component blocks appropriate for deletion, and identifying resistor components and converting resistor components to logical HDL representations.

In another embodiment, the present invention is a system with a processor and a database including a rule library of initial conditions. The processor is configured to execute instructions resulting the processor performing the steps of loading a physical hardware description language (HDL) representation of the system or creating a physical HDL representation from a physical schematic of the system, identifying from the physical HDL representation power nets and component blocks, loading from a rule library initial condition rules for the power nets and the component blocks, assigning the initial condition rules to the power nets and component blocks, and using at least in part the initial condition rules to transform the physical HDL representation to a logical HDL representation by identifying connector blocks and converting the connector blocks to hierarchical IO logical HDL representations, identifying component blocks appropriate for conversion to logical instantiations and converting the appropriate component blocks to logical HDL representations, identifying component blocks appropriate for deletion and deleting the component blocks appropriate for deletion, and identifying resistor components and converting resistor components to logical HDL representations.

In another embodiment, the present invention is an article of manufacture including a data storage medium, the data storage medium including a set of machine-readable instructions that are executable by a processing device to implement an algorithm. The algorithm including the steps of loading a physical hardware description language (HDL) representation of the system or creating a physical HDL representation from a physical schematic of the system, identifying from the physical HDL representation power nets and component blocks, loading from a rule library initial condition rules for the power nets and the component blocks, assigning the initial condition rules to the power nets and component blocks, and using at least in part the initial condition rules to transform the physical HDL representation to a logical HDL representation by identifying connector blocks and converting the connector blocks to hierarchical IO logical HDL representations, identifying component blocks appropriate for conversion to logical instantiations and converting the appropriate component blocks to logical HDL representations, identifying component blocks appropriate for deletion and deleting the component blocks appropriate for deletion, and identifying resistor components and converting resistor components to logical HDL representations.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

While the DUT process holds up fairly well when verifying an HDL design bound within a particular integrated circuit (IC) packaging types (e.g., ASIC, FPGA, PAL), it can become problematic when trying to verify a system of logic IC packages spanning a printed circuit (PC) card or multiple PC cards connected via cables and/or backplane PC cards. The interconnection devices between the IC packages are primarily only for static topological interconnection, providing very little actual logical function to the logic system being verified. They are also not typically described in an HDL and, if they are, the information encapsulated in the HDL description of the PC cards and/or cables is of a physical, not logical, nature. Typically, when a designer wishes to create a DUT which consists of multiple IC's, he or she must create a unique HDL description of the static, logical topological connection information between the system of IC's needing to be verified, a logical model if you will, of the topology of physical components of PC cards, cables, and/or backplanes contained within the logical system needing to be verified. This specialized piece of verification-only, topological information must be meticulously maintained to continue to match the logical, topological information in the PC cards, cables, and backplanes being designed in concert with the logical IC design work as part of a complete logic system. Also, this specialized piece of verification-only, topological information is a mirrored design effort to the actual design of the PC cards, cables, and backplanes of the system, essentially requiring duplicate design and extra synchronization work to provide a topological backbone for the entire system in order to verify the entire system.

Thus, a need exists for a transformation process to move the physical, topological information for a system (provided by the PC cards, cables, and backplanes) into a description (in HDL) providing all the logical, topological information necessary to create the interconnection system between IC's of a larger system which matches the physical system, allowing for the creation of a simulation model of an entire logical system.

Figure 1:
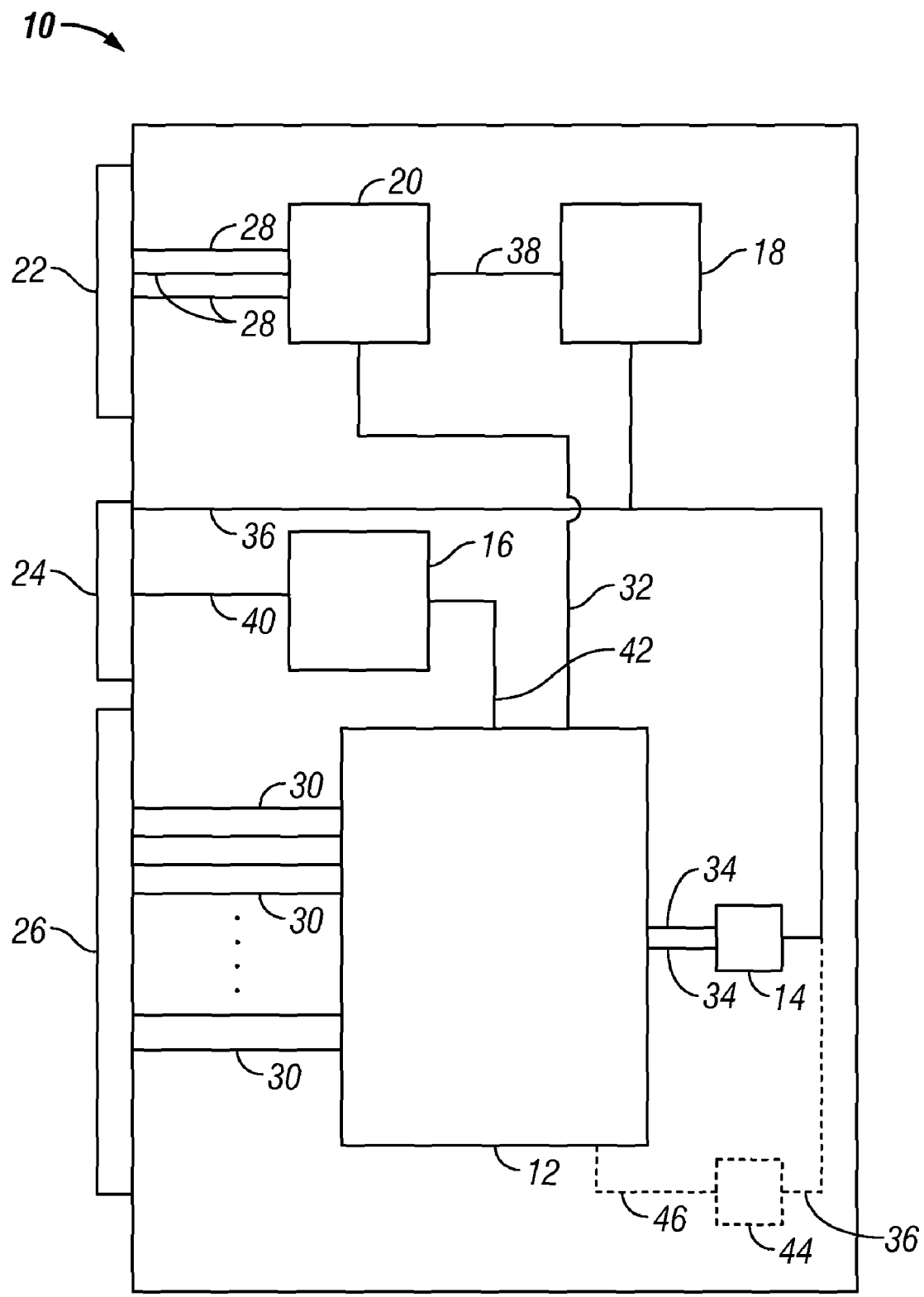
FIG. 1 illustrates an exemplary printed circuit card whose physical representation can be transformed to a logical representation according to an embodiment of the present invention.

FIG. 1 shows a schematic of an exemplary printed circuit (PC) card 10 for which an HDL logical representation can be created from a physical representation of card 10 according to an embodiment of the present invention. PC card 10 includes components 12, 14, 16, 18, and 20, which can be ASICs, FPGAs, PALs, PLAs, CPLDs, oscillators, memory devices, power components, and the like. PC card 10 also includes connectors 22, 24, and 26, which are particular types of components. An I/O net 28 connects between connector 22 and component 20. An I/O net 30 connects between connector 26 and component 18. An I/O net 32 connects between components 12 and 20. A clock net 34 connects between components 12 and 14. A power net 36 connects between connector 24 and components 14 and 18. A power net 38 connects between components 18 and 20. A power net 40 connects between connector 24 and component 16. A power net 42 connects between components 16 and 12. Component 12 may require an external oscillator component 44, which receives power on power net 36 and is connected to component 12 by oscillator net 46.

Figure 2:
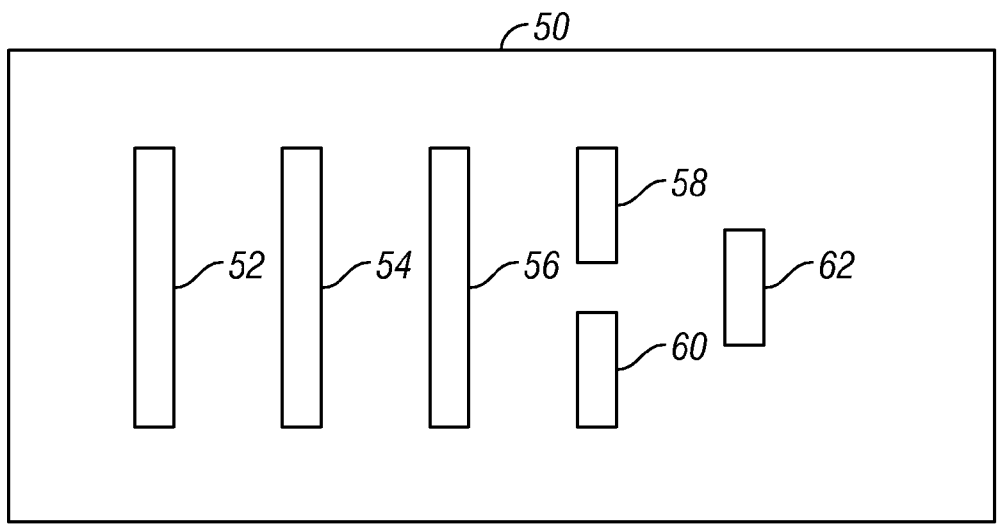
FIG. 2 illustrates an exemplary backplane whose physical representation can be transformed to a logical representation according to an embodiment of the invention.

FIG. 2 is a schematic of an exemplary backplane 50 for which an HDL logical representation can be created from a physical representation of backplane 50 according to an embodiment of the present invention. Backplane 50 includes connectors 52, 54, 56, 58, 60 and 62, each of which can be connected to a PC card such as PC card 10 of FIG. 1 or other element of a functional logic system or sub-system.

Figure 3:
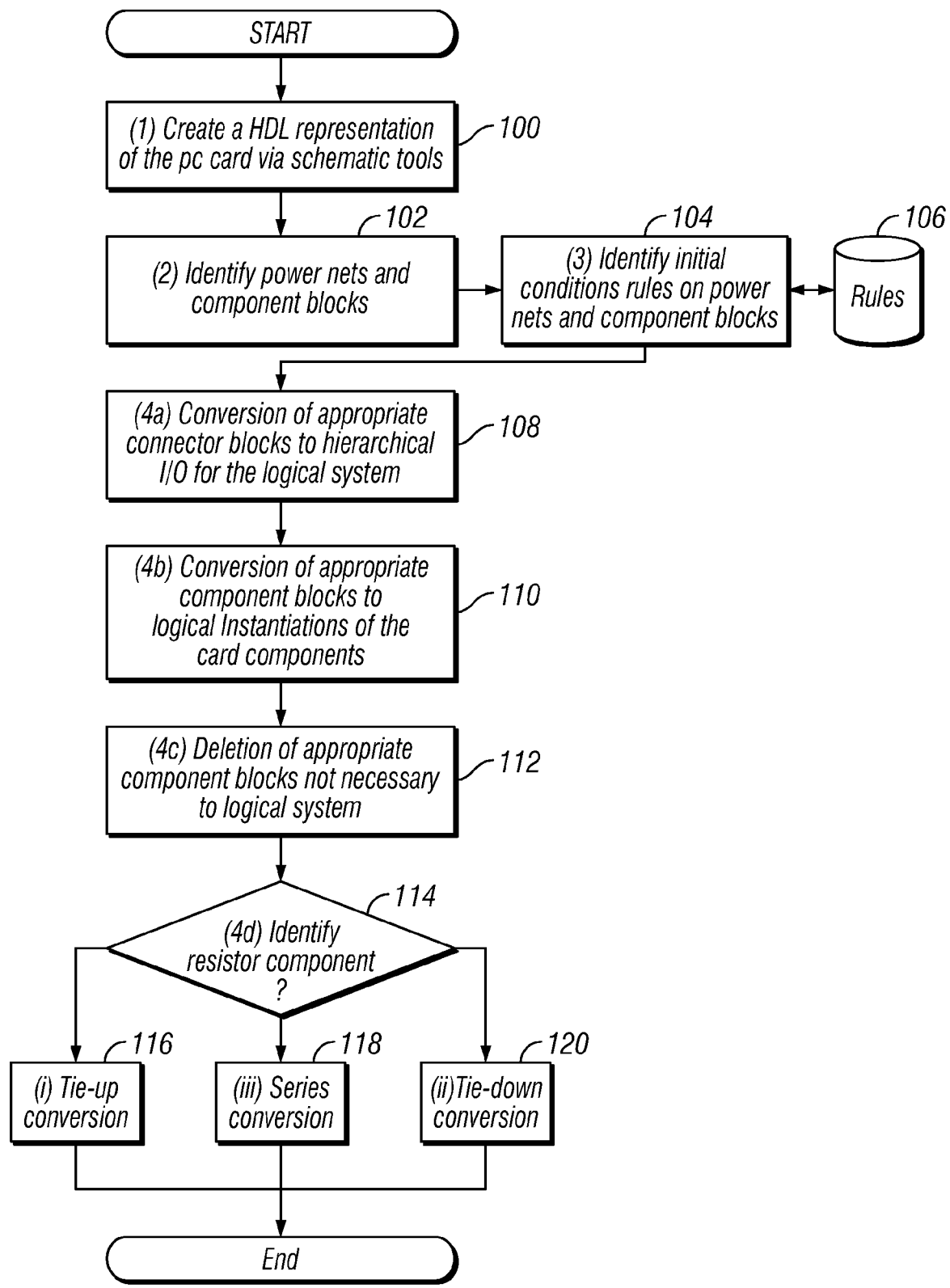
FIG. 3 is a flow chart illustrating a method of transforming a physical representation of a system to a logical representation of a system according to an embodiment of the invention.

FIG. 3 is a flow chart illustrating a method of generating a logical representation of a functional logic system or sub-system from a physical representation of the functional logic system or sub-system according to an embodiment of the present invention. The method may be discussed with reference to exemplary PC card 10 of FIG. 1; however, the method can be applied to systems comprising other configurations of systems, sub-systems, backplanes, PC cards and/or components. In step 100, a physical hardware description language (HDL) representation of the system is loaded or created. If a physical HDL representation is not readily available, a physical HDL representation can be created via schematic tools from a physical schematic of system. The physical HDL representation includes information about each of the physical components of the system (e.g., PC card 10 of FIG. 1). In step 102, the physical HDL representation is used to identify power nets and component blocks (e.g., components 12, 14, 16, 18, 20, 22, 24, 26, and 44 and power nets 36, 38, 40, and 42 of PC card 10 of FIG. 1). A list or other representation of the identified power nets and component blocks can be built for use in later steps. In step 204, initial condition rules assigned to the previously identified power nets and component blocks. The initial condition rules are accessed from a library of initial condition rules 106, which is prepared by a circuit designer prior to the start. Rule library 106 contains initial condition rules for at least the power nets and component blocks.

For the power nets, the initial condition rule is assigned to a given net by determining the type of power net, looking up the initial condition rule for that type of power net, and assigning the initial condition rule. In this way, an initial condition rule can be assigned to a given power net to indicate whether the power net is necessary or unnecessary for the logical operation of the system, describes a supplied voltage to the system, or describes the ground to the system. Other appropriate initial condition rules can be used to identify the power nets. In most transformations of physical systems to functional logical systems power nets are not considered functional in a logical sense and usually are deleted from the system. However, the power system is the mechanism by which all logic values for a functional logical system are derived. If the power system does not drive the functional logical system properly in a static, topographical sense many functional logic circuits will not operate properly (i.e., open-collector driver). Additionally, verification of the overall static connection of the power system can be verified in a logical system if consistent care is taken in the creation of the rule set for the power nets within the system.

The initial condition rules for the every one of the component blocks are similarly assigned. The initial condition rule for a given component block encapsulates the logical function of the physical component block within a physical logic system. The characteristics of the logical attributes of a set of physical component blocks are specified by the initial condition rules defined for the component blocks within the system. The initial condition rules can be defined to have a single rule which spans every instance of a particular type of component block within a system. The initial condition rules can also be defined with multiple rules for a particular type of component block, each rule describing particular initial conditions for an instance of a particular component in the system, which may depend upon the specific characteristics of the component or the logical function of the system. The initial conditions are used to create logical, functional system models of the physical system for verification across the entire design cycle, which can result in a consistent systematic treatment of the transform of the physical components into the functional, logical counterparts. To this end, the initial condition rule assigned to a component block determines if or how the component block is transformed from a physical representation to a logical representation. The initial condition rule for a given component block can indicate whether the component block is unnecessary to the logical function of the system being synthesized. The rules can be coded globally to indicate that all components of a particular type or specific instances of a component are unnecessary. The initial condition can also indicate whether all of the pins of a physical component are necessary to describe the logical equivalent for the component in the logical representation. If the component block or pin is unnecessary, it can be discarded from the logical representation of the system. The initial condition can indicate other logical parameters that are used during the transformation process as described below. For example, the initial condition for a connection component (e.g., a card connector) can indicate that the connection component will require transformation into a logical connection interface to a higher level of the logical system being synthesized for verification. As a further exemplar, if the component block is a resistor, the initial condition rule can indicate whether the resistor has a tie-up, tie-down, or series topology.

Once the initial conditions for the power nets and component blocks have been identified and/or determined, the power nets and components can be transformed to a logical representation (e.g., logical HDL) or deleted. In step 108, appropriate component blocks converted to hierarchical I/O for the logical representation. In a physical representation of a PC card, a connector is described no differently than any other component on the PC card. In a functional, logical system, however, the connector is a portal, a logical gateway between the various levels of hierarchy within the functional, logical system. Based on the appropriate initial condition rules for the connectors within the physical system created earlier in the process, a consistent transform can be applied to create the appropriate hierarchical, logical connection mechanism within the functional, logical system. The initial condition rule also acts as a binding mechanism, binding the connection pins in the physical domain to the logical, hierarchical connections in the logical domain, a binding mechanism that can be utilized to verify the logical correctness of the physical pin locations in the physical system. The pins of these connection components are converted into the logical connection interface by which a higher level HDL entity can instantiate the system's logical representation (i.e., logical HDL) that is that is being created or by which the system can instantiate a lower level HDL entity. In step 110, appropriate component blocks are converted to logical instantiations of the appropriate component blocks. For example, physical component blocks that describe the connection to components that have their own logical instantiation, such as processor or memory chips, can be converted to a logical description of the instantiation of the component (i.e., processor or memory chips). In step 112, appropriate component blocks are deleted, which includes at least the component blocks identified as unnecessary during step 104. For example, component blocks that have no logical function can be deleted. Step 112 can also include the deletion of unnecessary power nets and unnecessary pins from component blocks.

Figure 4:
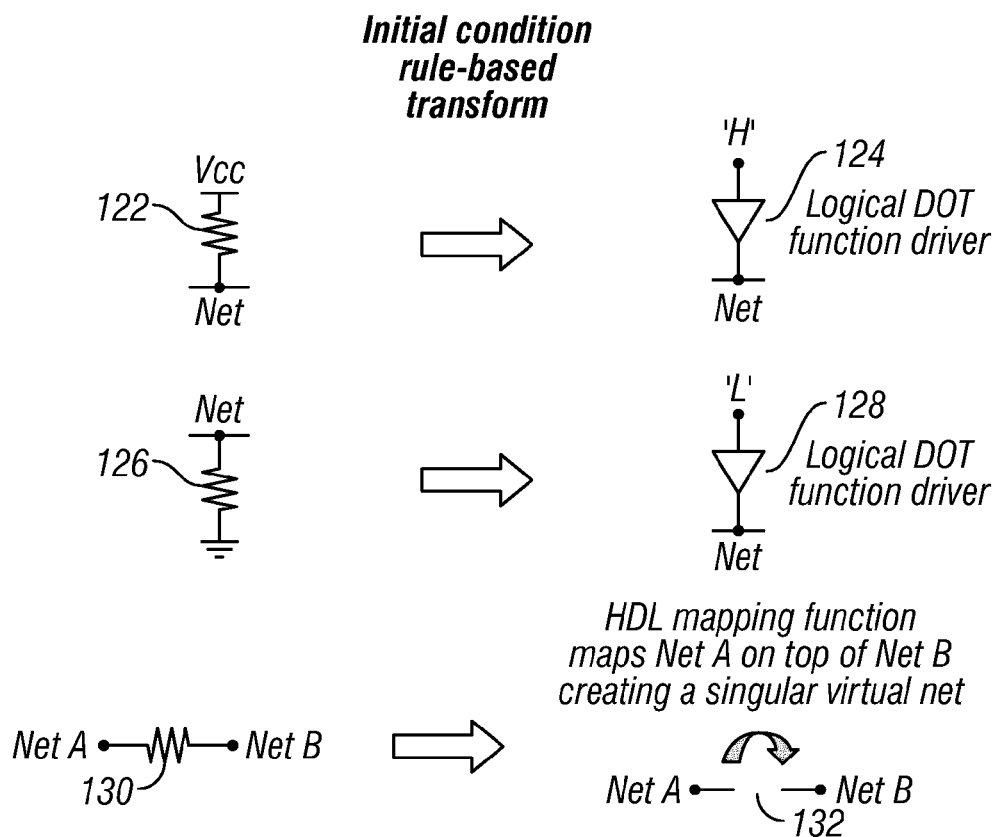
FIG. 4 illustrates set of resistor transforms.

In step 114, resistor components are converted to logical representations according to a set of transforms. In a physical system, topologies of resistor networks are used for a variety of physical and functional reasons (termination, driver augmentation, etc.) These resistor topologies characteristically contain a logical component and the power component. The power component of the topologies cannot be simply dropped for it provides necessary logical function. An appropriate transform (based on initial condition rules for the resistor components within the topology in question) must be performed to consistently transform the resistor topology without dropping its necessary power function to the logical function. FIG. 4 includes initial condition rule-based transforms for an exemplar subset of resistor topologies. A tie-up resistor 122 physically ties a signal line to a voltage supply power net and is transformed to a logical representation 124 of a soft logic '1' to the signal net being tied to the voltage supply power net. A tie-up resistor 126 physically ties a signal line to a ground power net and is transformed to a logical representation 128 of a soft logic '0' to the signal net being tied to the ground power net. A series resistor 130 provides a resistive connection between two signal nets and is transformed to a VHDL logical representation 132 by mapping the nets connected by resistor 130 to each other, which provides a virtual connection between the nets via the VHDL alias command. Alternatively, a logical model of a series resistor can be instantiated in place of the physical resistor component.

Applying the above steps, a physical HDL representation of a PC card can be transformed to a logical HDL representation of that same PC card. The resulting logical representation is then usable for the creation of a logical simulation model of that PC card. This representation can be used as the entire representation of the logical subsystem to be verified or can be folded into a larger logical subsystem of multiple PC cards. This logical subsystem, created via the application of the above transform, can allow for the creation of a DUT appropriate to verification needs, is free from errors of simulation-only models of the PC card topologies, and provides a simulation verification path of the testing of the schematic wiring of the PC card that is integral to the entire logical subsystem.

Figure 5:
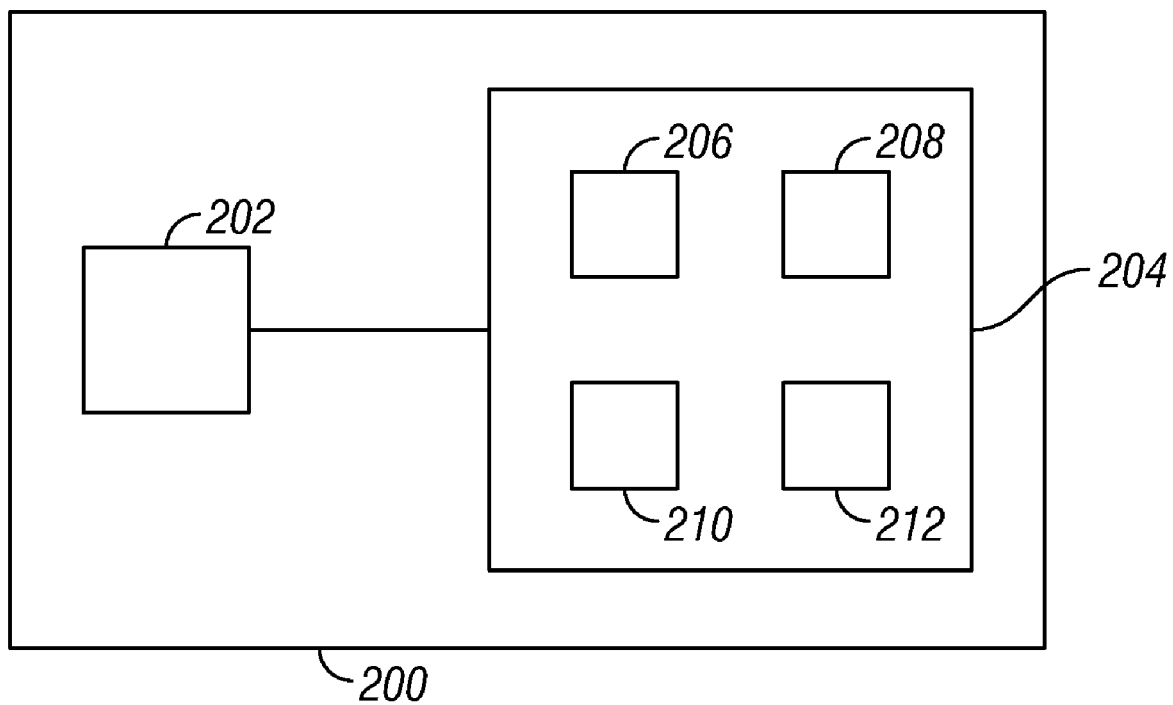
FIG. 5 is a diagram of a computer system according to an embodiment of the invention.

FIG. 5 is a block diagram of a computer system, or module, 200 according to an embodiment of the present invention. A processing module 202 is connected to a database module 204. Database module 204 includes an instruction module 206, a physical representation module 208, a logical representation module 210, and a rule library module 212. Instruction module 206 is configured to cause processing module 202 to implement the method for generating a logical representation of a functional logical system form a physical representation of the system that is illustrated in FIG. 3 and described above. Physical representation module 208 is configured to store the physical description of the functional logical system. Logical representation module 210 is configured to store the logical description of the function logical system. Rule library module 212 is configured to include the initial condition rules used by the processing module 202 during the implementation of the method that is illustrated in FIG. 3.

Some of the functional units described in this specification have been labeled as modules in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The schematic flow chart diagram included is generally set forth as a logical flow-chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

What is claimed is:

1. A method of generating a logical representation of a functional logical system from a physical representation of the system, the method comprising:
    loading a physical hardware description language (HDL) representation of the system and creating a physical HDL representation from a physical schematic of the system;
    identifying from the physical HDL representation power nets and component blocks, loading from a rule library initial condition rules for the power nets and the component blocks, and assigning the initial condition rules to the power nets and component blocks; and
    using at least in part the initial condition rules to transform the physical HDL representation to a logical HDL representation by
        identifying connector blocks and converting the connector blocks to hierarchical IO logical HDL representations;
        identifying component blocks appropriate for conversion to logical instantiations and converting the appropriate component blocks to logical HDL representations;
        identifying component blocks appropriate for deletion and deleting the component blocks appropriate for deletion; and
        identifying resistor components and converting resistor components to logical HDL representations.

2. The method of claim 1, further comprising preparing the initial condition rules and building the rule library.

3. The method of claim 1, wherein the initial condition rules comprise rules configured to identify a particular type of a component block as being appropriate for deletion.

4. The method of claim 1, wherein the initial condition rules comprise rules configured to identify a specific instantiation of a component block as being appropriate for deletion.

5. The method of claim 1, wherein converting resistor components comprises at least one of a tie-up conversion, a tie-down conversion, and a series conversion.

6. The method of claim 5, wherein the tie-up conversion comprises assigning a soft-logic one, tie-down conversion comprises assigning a soft-logic zero, and series conversion comprises one of mapping a set of signal nets to each other and instantiating a logic model of a series resistor.

7. The method of claim 1, further comprising deleting at least one pin of a component block that is unnecessary to describe a logical equivalent of the component block.

8. The method of claim 1, wherein connector blocks are converted to one of a higher and lower level of a functional logical system.

9. A computer system comprising:
    a processing module; and
    a database module comprising a rule library module and a non-transitory instruction module encoded with instructions which when executed cause the processing module to perform the steps of:
        loading a physical hardware description language (HDL) representation of the system and creating a physical HDL representation from a physical schematic of the system;
        identifying from the physical HDL representation power nets and component blocks, loading from the rule library initial condition rules for the power nets and the component blocks, and assigning the initial condition rules to the power nets and component blocks; and
        using at least in part the initial condition rules to transform the physical HDL representation to a logical HDL representation by
            identifying connector blocks and converting the connector blocks to hierarchical IO logical HDL representations;
            identifying component blocks appropriate for conversion to logical instantiations and converting the appropriate component blocks to logical HDL representations;
            identifying component blocks appropriate for deletion and deleting the component blocks appropriate for deletion; and
            identifying resistor components and converting resistor components to logical HDL representations.

10. The computer system of claim 9, wherein the initial condition rules comprise rules configured to identify a particular type of a component block as being appropriate for deletion.

11. The computer system of claim 9, wherein the initial condition rules comprise rules configured to identify a specific instantiation of a component block as being appropriate for deletion.

12. The computer system of claim 9, wherein the initial condition rules comprise rules configured to identify pins of component blocks as being appropriate for deletion.

13. An article of manufacture including a non-transitory data storage medium, said non-transitory data storage medium including a set of machine-readable instructions that are executable by a processing device to implement an algorithm, said algorithm comprising the steps of:
loading a physical hardware description language (HDL) representation of the system and creating a physical HDL representation from a physical schematic of the system;
identifying from the physical HDL representation power nets and component blocks, loading from a rule library initial condition rules for the power nets and the component blocks, and assigning the initial condition rules to the power nets and component blocks; and
using at least in part the initial condition rules to transform the physical HDL representation to a logical HDL representation by
identifying connector blocks and converting the connector blocks to hierarchical IO logical HDL representations;
identifying component blocks appropriate for conversion to logical instantiations and converting the appropriate component blocks to logical HDL representations;
identifying component blocks appropriate for deletion and deleting the component blocks appropriate for deletion; and
identifying resistor components and converting resistor components to logical HDL representations.

14. The article of manufacture of claim 13, further comprising preparing the initial condition rules and building the rule library.

15. The article of manufacture of claim 13, wherein the initial condition rules comprise rules configured to identify a particular type of a component block as being appropriate for deletion.

16. The article of manufacture of claim 13, wherein the initial condition rules comprise rules configured to identify a specific instantiation of a component block as being appropriate for deletion.

17. The article of manufacture of claim 13, wherein converting resistor components comprises at least one of a tie-up conversion, a tie-down conversion, and a series conversion.

18. The article of manufacture of claim 17, wherein the tie-up conversion comprises assigning a soft-logic one, tie-down conversion comprises assigning a soft-logic zero, and series conversion comprises one of mapping a set of signal nets to each other and instantiating a logic model of a series resistor.

19. The article of manufacture of claim 13, further comprising deleting at least one pin of a component block that is unnecessary to describe a logical equivalent of the component block.

20. The article of manufacture of claim 13, wherein connector blocks are converted to one of a higher and lower level of a functional logical system.

* * * * *